United States Patent

Parks

[15] 3,705,332

[45] Dec. 5, 1972

[54] ELECTRICAL CIRCUIT PACKAGING STRUCTURE AND METHOD OF FABRICATION THEREOF

[72] Inventor: Howard L. Parks, 23335 Calvert St., Woodland Hills, Calif. 81305

[22] Filed: June 25, 1970

[21] Appl. No.: 49,873

Related U.S. Application Data

[63] Continuation-in-part of Ser. No. 613,652, Feb. 2, 1967, abandoned.

[52] U.S. Cl. ................317/101 CM, 29/625, 29/626, 174/35, 174/68.5, 317/101 CC

[51] Int. Cl. ............................H05k 1/08, H05k 1/18

[58] Field of Search ...............174/68.5, 88, 36, 35 R; 317/101 C, 101 CM, 101 D, 101 CP; 29/624–626; 156/3

[56] References Cited

UNITED STATES PATENTS

| | | | |
|---|---|---|---|
| 3,351,816 | 11/1967 | Sear et al. | 174/36 X |
| 3,499,219 | 3/1970 | Griff et al. | 174/68.5 X |
| 3,541,222 | 11/1970 | Parks et al. | 174/68.5 |

*Primary Examiner*—Darrell L. Clay
*Attorney*—Frederick M. Arbuckle

[57] ABSTRACT

An electrical circuit packaging structure and method of fabrication thereof. The packaging structure is comprised of one or more batch fabricated electrically conductive wafers stacked together under pressure to form a parallelpiped structure containing one or more active components (e.g., integrated circuit chips) as well as conductor means providing coaxial interconnections in X-, Y-, and Z-axis directions. A stack is normally comprised of conductive wafers of different types including component wafers, interconnection wafers, and connector wafers. Z-axis interconnections, i.e., through-connections in a wafer, are formed by slugs contained within the wafer profile extending between the top and bottom wafer surfaces. Each slug is surrounded by dielectric material which supports the slug and electrically isolates it from the remainder of the wafer material. X–Y axis interconnections are formed by conductors also contained within the wafer profile and surrounded by dielectric material providing support and electrical isolation. The Z-axis slugs and X–Y axis conductors are preferably formed in a wafer by selective chemical etching of the wafer from opposite surfaces thereof. The removed wafer material is replaced with dielectric material to physically support and electrically isolate the slug or conductor from the remaining wafer material.

6 Claims, 11 Drawing Figures

INVENTOR
HOWARD L. PARKS
BY
Lindenberg, Freilich & Wasserman
ATTORNEYS

INVENTOR
HOWARD L. PARKS
BY Lindenberg, Freilich & Wasserman
ATTORNEYS

INVENTOR
HOWARD L. PARKS
BY Lindenberg, Freilich & Wasserman
ATTORNEYS

INVENTOR
HOWARD L. PARKS
BY Lindenberg, Freilich & Wasserman
ATTORNEYS

INVENTOR
HOWARD L. PARKS
BY Lindenberg, Freilich & Wasserman
ATTORNEYS

INVENTOR
HOWARD L. PARKS
BY Lindenberg, Freilich & Wasserman
ATTORNEYS

ELECTRICAL CIRCUIT PACKAGING STRUCTURE AND METHOD OF FABRICATION THEREOF

CROSS-REFERENCES TO RELATED APPLICATIONS

This application is a continuation-in-part of U.S. Pat. application Ser. No. 613,652, filed Feb. 2, 1967, by Howard L. Parks, now abandoned and assigned to the same assignee as the present application.

BACKGROUND OF THE INVENTION

1. Field of the Invention

This invention relates generally to an electrical circuit packaging structure and a method of fabrication thereof.

Considerable effort has been expended in recent years in an attempt to optimize the packaging of complex high speed electronic systems which may incorporate several active semiconductor circuit chips. The design objectives of these packaging efforts have been, among other things, to maximize the utilization of space, provide a high degree of reliability, provide wide bandwidth interconnections usable at high frequencies, minimize cross talk, and assure adequate heat removal, while at the same time providing economical methods of fabrication.

2. Description of the Prior Art

The following U.S. patents and patent applications, all assigned to the assignee of the present application, disclose various related structures and fabrication methods pertaining to the packaging of high speed electronic systems:

U.S. Pat. No. 3,351,702
U.S. Pat. No. 3,351,816
U.S. Pat. No. 3,351,953
U.S. Pat. No. 3,499,219
Application Ser. No. 819,888, filed Apr. 28, 1969, now abandoned.

In accordance with the present invention, a packaging structure is provided typically comprised of one or more batch fabricated electrically conductive plates or wafers stacked together to form a parallelpiped structure containing one or more active components (e.g., integrated circuit chips) as well as conductor means providing coaxial interconnections in X- Y- and Z-axis directions.

One of the most difficult problems presented in providing a stacked conductive wafer structure involves the provision of reliable Z-axis interconnections, not only within a wafer, but most particularly where a Z-axis interconnection has to be carried through many wafers. Accordingly, an important aspect of the invention resides in the manner in which reliable Z-axis interconnections are provided in a stacked wafer structure.

In accordance with a more specific aspect of the invention, Z-axis interconnections are formed by the use of selective chemical etching of opposite wafer surfaces to electrically isolate selected portions (islands) of each conductive wafer to thus form slugs extending between the top and bottom wafer surfaces. In a preferred embodiment of the invention, wafer portions (islands) elongated in the plane of the wafer are isolated from the remainder of the wafer to serve as X–Y axis conductors. These X–Y axis conductors are preferably buried, i.e., recessed from the top and bottom wafer surfaces, while the Z-axis slugs extend through and are exposed at the top and bottom wafer surfaces for interconnection with correspondingly positioned slugs in adjacent wafers.

In the preferred embodiments of the invention, different types of wafers are incorporated in the same stack. Thus, for example, a typical stack may be comprised of component wafers, interconnection wafers, and connector wafers. The component wafers support and provide connections to active circuit devices, such as integrated circuit chips. The interconnection wafers generally provide both X-, Y- and Z-interconnections and the connector wafers provide Z-axis slugs for connection between wafers.

In accordance with a further aspect of the invention, predetermined Z-axis slugs in the wafers are provided with maleable conductive material (contacts) on their ends so that reliable Z-axis interconnections are obtained when the wafers are stacked under pressure in the Z-axis direction. Also, it has been found advantageous to provide a uniform patter of aligned Z-axis slugs extending throughout the stack so as to provide uniform pressure distribution, and also to provide convenient test points for testing interconnections within the stack.

In accordance with still another aspect of the invention, the connector wafers are advantageously constructed and arranged so that they not only provide for Z-axis connections between wafers, but also serve to complete the coaxial shielding of the X–Y conductors. This is preferably achieved by providing additional maleable conductive material (contacts) on the top and bottom surfaces of each connector wafer to contact adjacent wafers to thus form an electrically continuous ground plane around the X–Y conductors.

In the preferred method of fabricating structures in accordance with the present invention, the conductive islands are formed in the wafers by first selectively etching the top wafer surface, replacing the removed wafer material with dielectric material, and then correspondingly etching the bottom wafer surface to bare the dielectric material and thus electrically isolate the conductive islands from the remainder of the wafer. The dielectric material, of course, provides mechanical support for the island as well as electrically isolating it from the remainder of the wafer.

In accordance with a still further aspect of the invention, some of the wafers in a stack are preferably provided with extending resilient fingers for contacting a housing to maximize heat transfer out of the stack.

Figure 1:
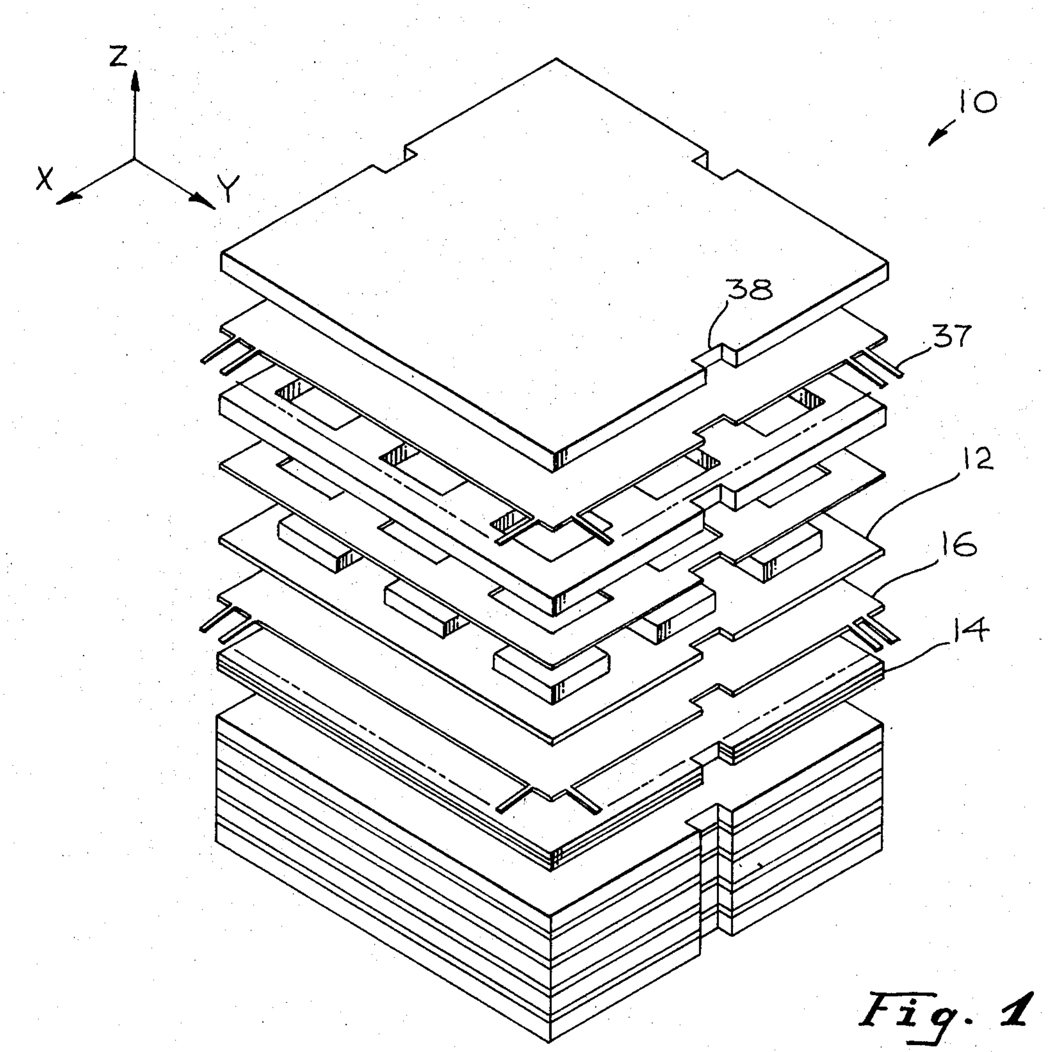
FIG. 1 is a perspective view of a disassembled multilayer electrical circuit structure in accordance with the present invention.

Attention is now called to FIG. 1 which illustrates a partially disassembled circuit structure in accordance with the present invention. Electrical circuit structures are implemented in accordance with the present invention by stacking a multiplicity of conductive wafers fabricated so as to cooperate with one another to form desired coaxial connection in X-, Y-, and Z-axis directions. The wafer stack 10 illustrated in FIG. 1 is comprised of a plurality of different wafers which essentially fall into the following three classes: component wafers 12, interconnection wafers 14, and connector wafers 16. As will be seen hereinafter, a component wafer is used to physically support and provide electrical connection to active circuit devices such as integrated circuit chips. LSI chips, etc. Each component wafer provides means for connecting the terminals of the active device of Z-axis conductors or slugs for interconnection to adjacent wafers.

The interconnections wafers 14 are fabricated so as to include Z-axis slugs as well as X–Y conductors extending in the plane of the wafer. The connector wafers 16 provide a uniform matrix of Z-axis slugs forming through-connections for providing wafer to wafer interconnections. As will be seen hereinafter, a circuit structure in accordance with the present invention is formed by stacking appropriately designed wafers under pressure so as to enable connector wafer Z-axis slugs to connect to slugs aligned therewith in adjacent wafers. In this manner electrical interconnections are formed from wafer to wafer enabling desired circuit points to be made available external to the stack.

As will be better appreciated hereinafter, electrical circuit structures in accordance with the present invention, when ultimately packaged, form substantially solid parallelpiped structures having at least the following advantageous characteristics: (1) efficient utilization of space; (2) wide bandwidth interconnections usable at high frequencies; (3) minimum interference or cross talk between circuits; (4) efficient heat removal capability; (5) high reliability; and (6) adaptability to a variety of types of active components.

As will be discussed in greater detail hereinafter, the coaxial X-, Y- and Z-interconnections provided in a structure in accordance with the invention are formed by working conductive (e.g., copper) wafers so as to form X-, Y- and Z-axis conductors within the profile of the wafers by isolating selected portions of islands from the remainder of the wafer material. More particularly, as will be seen, conductors extending in the X–Y and Z-axis directions are formed by removing sufficient material from the wafer to physically and electrically isolate a conductive portion thereof from the remainder of the wafer. The isolated portion or island is physically supported by the wafer and electrically insulated therefrom by dielectric material introduced to replace the removed wafer material.

Figure 2:
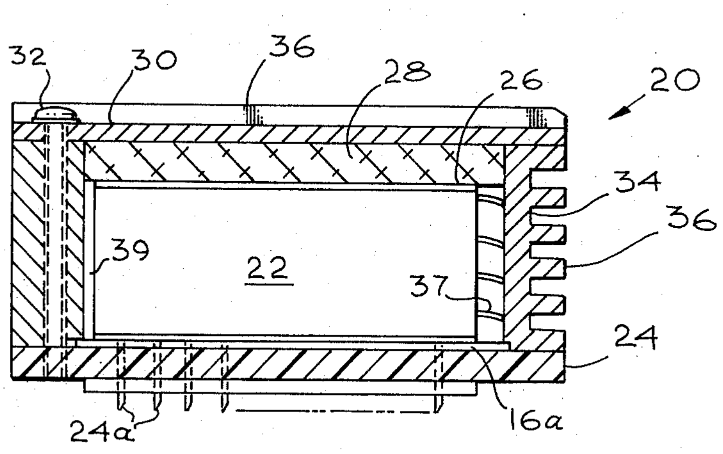
FIG. 2 is a sectional view of a multi-layer circuit structure in accordance with the present invention contained within a suitable housing.

Prior to discussing the internal details of the wafer structures and the preferred method of fabricating the wafers, attention is called to FIG. 2 which illustrates a preferred embodiment of the present invention mounted within a suitable metallic housing 20. More particularly, FIG. 2 illustrates a wafer stack 10 mounted in the housing 20 between a connector block 24 and a top pressure plate 26. The connector block 24 contains insulated through-conductor output terminal pins **24*a* electrically coupled to the stack 10 by an output connector wafer 16*a* so as to thereby permit convenient electrical connection of the stack and housing to external electrical circuitry. The stack is held under pressure in the Z-axis direction by a resilient pressure pad 28 bearing against the plate 26. The pressure pad 28 is held compressed by a cover plate 30 secured by bolt 32. The cover plate 30 and the housing walls 34 are provided with spaced elongated fins 36 projecting perpendicularly outwardly therefrom. The fins 36 of course, function to maximize heat transfer from the housing 20 to the surrounding cooling medium. In order to provide good heat transfer from the stack 10 of FIG. 1 to the housing walls, a plurality of wafers, such as the connector wafers, are provided with resilient fingers 37 preferably formed integral with the wafers, extending outwardly from the wafer periphery. Upon insertion of the stack into the housing, the fingers contact the inner surface of the housing walls, as shown in FIG. 2, to thus provide a good heat transfer path thereto. In order to laterally align the stack 10 in the housing 20, the wafers are provided with keyways 38 (FIG. 1) adapted to mate with key projections 39**.

As previously pointed out, all the wafers can be considered as falling into three types; namely the component wafers 12, the interconnection wafers 14, and the connector wafers 16. All of the wafers are basically quite similar in construction inasmuch as all essentially comprise wafers of conductive material such as copper having portions within the profile thereof isolated electrically from the remainder of the wafer.

Figure 3:
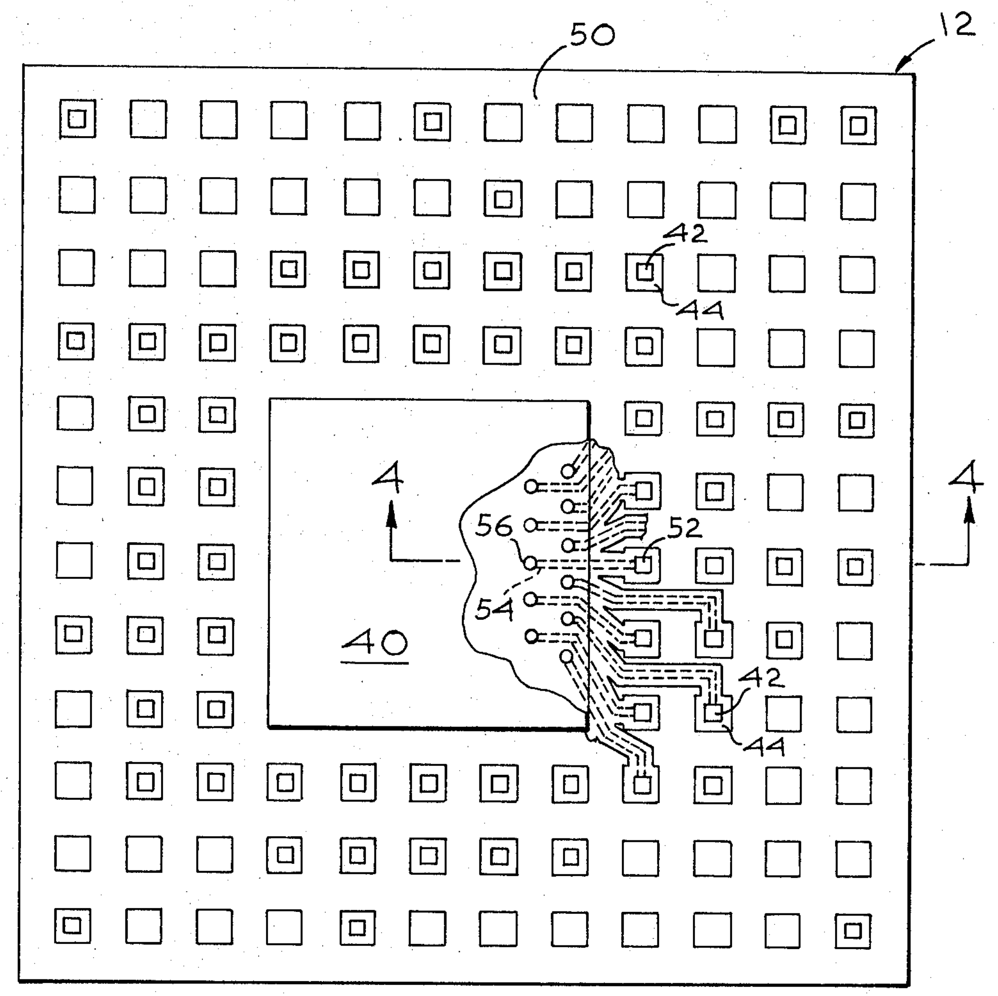
FIG. 3 is a fragmentary plan view illustrating a portion of a component wafer in accordance with the present invention.
Figure 4:
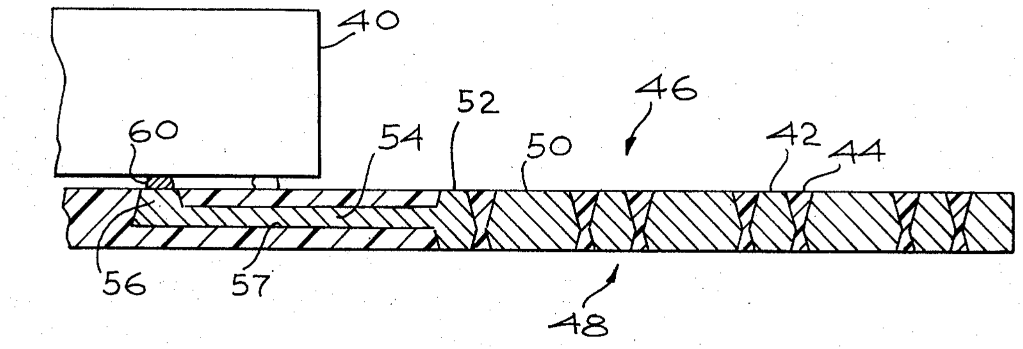
FIG. 4 is a sectional view taken substantially along the plane 4—4 of FIG. 3.

FIGS. 3 and 4 illustrate a portion of a component wafer 12 showing an active device chip 40 mounted thereon and connected thereto. The component wafer 12 has a plurality of Z-axis slugs 42 formed within the profile thereof, each slug 42 constituting an island isolated from the remainder of the wafer by dielectric material 44 disposed within an opening formed in the wafer extending between, and exposed at, the top surface 46 and the bottom surface 48 thereof. That is, each slug 42 shown in FIGS. 3 and 4 can be considered as being supported within an opening extending through the wafer by dielectric material 44 which both supports and electrically isolates the slug from the remaining wafer material 50. The slugs 42 shown in FIGS. 3 and 4 are preferably arranged in a uniform rectangular matrix, for example, on 50 mil centers in both the X- and Y-axis directions.

The active device 40 is a conventional device provided with a plurality of terminals and it is, of course, essential to be able to connect each of the active device terminals to a different Z-axis slug 42 in the component wafer 12. In order to connect each of the device terminals to a different Z-axis slug, the wafer 12 is formed so as to provide an area thereof, corresponding in shape to the shape of the active device 40, in which X–Y conductors extending within the plane of the wafer from a plurality of Z-axis slugs, terminate. Note, for example, slug 52 which is electrically connected to an X–Y conductor 54 extending in the plane of the wafer and terminating at terminal point 56 in the area of the wafer where the device 40 is to be mounted. As noted, the slug 52 extends between and is exposed at the top and bottom wafer surfaces 46 and 48. The X–Y conductor 54 connected thereto is elongated in the plane of the wafer between and recessed from the top and bottom surfaces 46 and 48 and terminates beneath the device 40 in the terminal point 56 which extends to and is exposed at the top wafer surface 46. Dielectric material 57 surrounds the slug 52, conductor 54 and terminal 56 to electrically isolate them from the remaining wafer material. Conductive material 60, such as a small portion of solder, interconnects the terminal point 56 to a terminal on the device 40.

It should be appreciated that the slug 52 constitutes a central conductor surrounded by the conductive wafer material 50 but isolated therefrom by dielectric material so as to constitute a coaxial conductor. As will be fully appreciated hereinafter, in a circuit structure ultimately packaged in accordance with the present invention, the X–Y conductors 54 within each wafer will also form central conductors of coaxial interconnections since each will be coaxially shielded by the remaining material of the wafer in whose profile it lies and material of adjacent wafers above and below in the stack. In other words, the number, size and spacings of the Z-axis slugs and the X–Y conductors in the various wafers are chosen with respect to the operating frequency range intended for the structure so that all of the interconnections within a stack, that is within the wafers as well as between wafers, effectively constitute coaxial interconnections.

Figure 5:
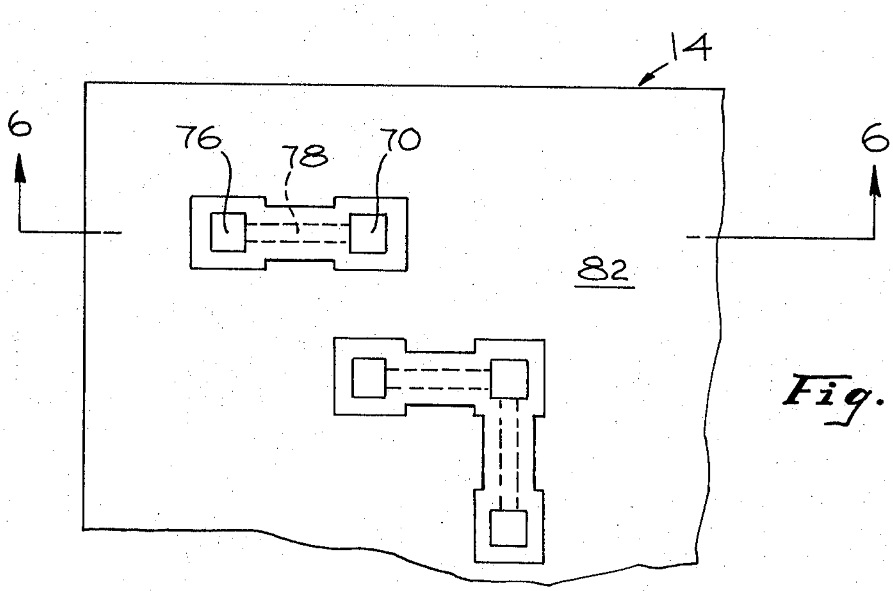
FIG. 5 is a fragmentary plan view illustrating a portion of an interconnection wafer in accordance with the present invention.
Figure 6:
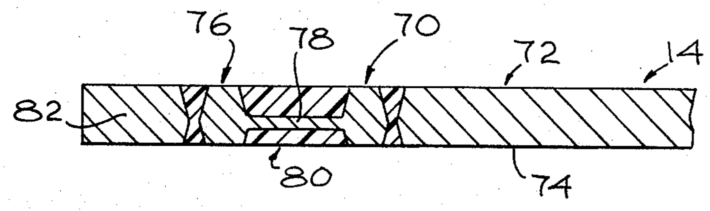
FIG. 6 is a sectional view taken substantially along the plane 6—6 of FIG. 5.

Attention is now called to FIG. 5 which illustrates a fragmentary portion of an interconnection wafer 14 which, as previously noted, functions to define X–Y as well as Z-axis interconnections. The interconnections are formed in the wafer 14 similarly to the previously discussed interconnections formed in the wafer 12. Thus, a typical wafer 14 defines a plurality of Z-axis slugs 70 extending between the top surface 72 and bottom surface 74 of the wafer 14. The Z-axis slug 70 is interconnected with another Z-axis slug 76, for example, by a recessed X–Y conductor 78. As was described in conjunction with FIGS. 3 and 4, both the X–Y conductors and Z-axis slugs are surrounded by dielectric material 80 which provides electrical insulation to the remaining wafer material 82.

Figure 7:
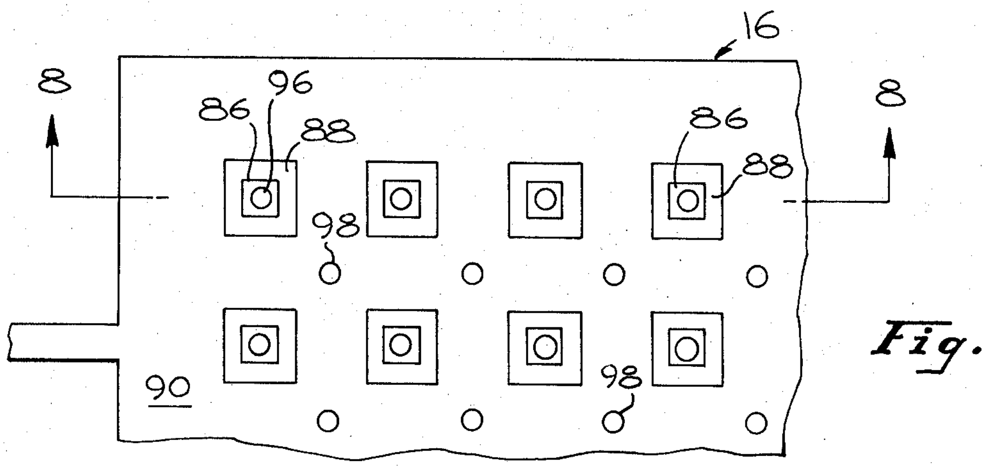
FIG. 7 is a fragmentary plan view illustrating a portion of a connector wafer in accordance with the present invention.
Figure 8:
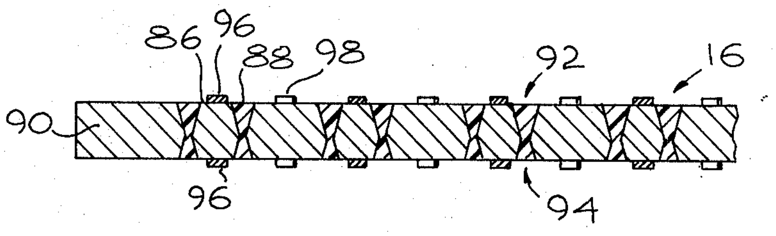
FIG. 8 is a sectional view taken substantially along the plane 8—8 of FIG. 7.

Attention is now called to FIGS. 7 and 8 which illustrate a connector wafer 16 which is formed to include a plurality of Z-axis slugs 86 preferably arranged in a uniform rectangular matrix. Each Z-axis slug 86 is completely surrounded by dielectric material 88 supporting the slug and electrically insulating it from the remainder of the wafer material 90. Each Z-axis slug 86 is exposed on the top and bottom wafer surfaces 92 and 94. Maleable contacts 96 are preferably provided on both ends of each of the slugs 86, i.e., at both the top surface 92 and the bottom surface 94. As will be seen hereinafter, alternate layers in the stack comprise connector wafers in order to provide Z-axis interconnections to wafers above and below which can constitute either interconnection or component wafers. The maleable contacts 96 are formed of more ductile material than the Z-axis copper slugs and so when the stack is placed under pressure within the housing 20 of FIG. 2, the contacts 96 are deformed by engagement with the aligned Z-axis slugs in adjacent wafers to thus form good interconnections between the wafers.

In addition to the contacts 96 formed on both surfaces of the connector wafers 16, similar maleable contacts 98 are provided on the remaining portion 90 of the wafer 16 in order to provide a good ground plane interconnection between wafers.

Figure 9:
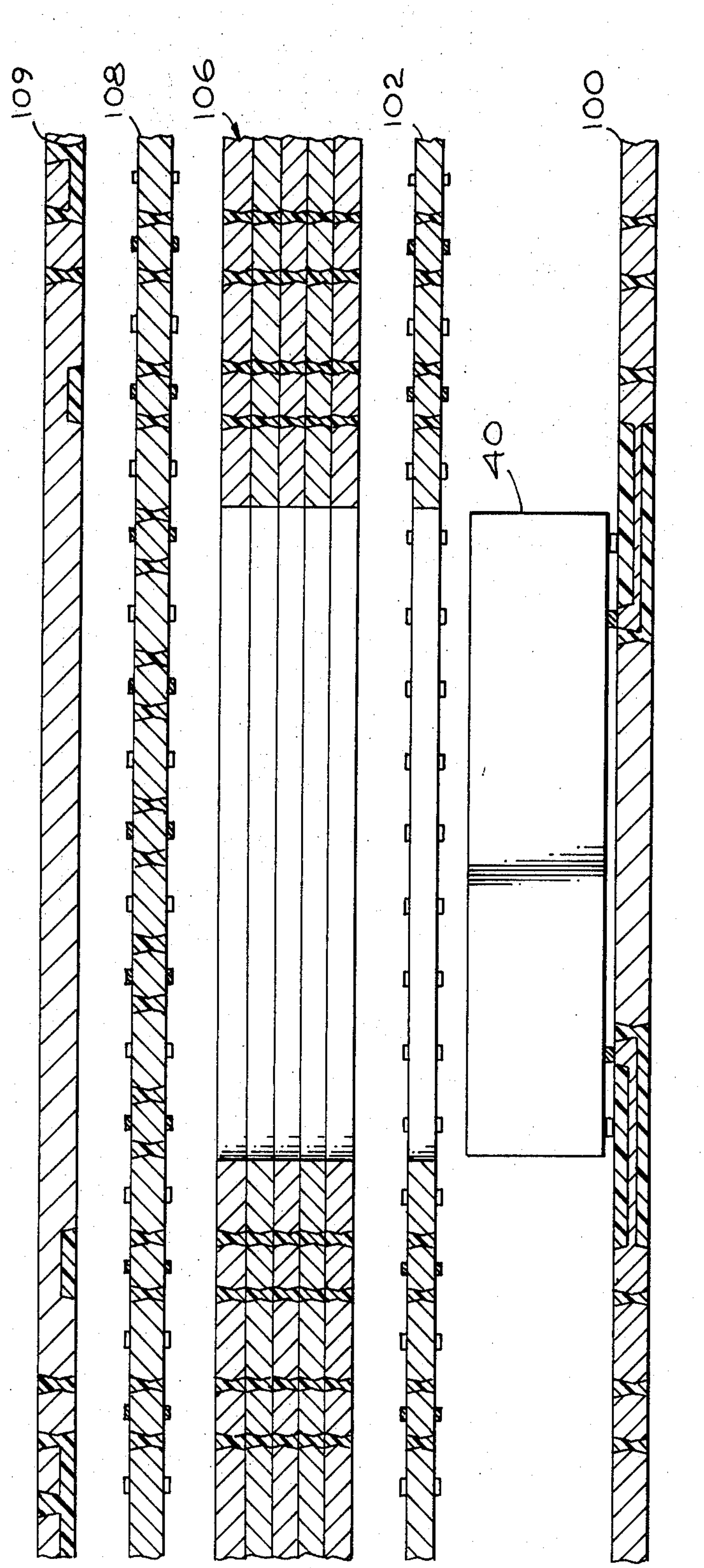
FIG. 9 is a sectional view illustrating a typical stack of component interconnection and connector wafers, in accordance with the present invention.

Attention is now called to FIG. 9 which illustrates the cross-section of a typical stack comprised of component wafers, connector wafers, and interconnection wafers. Note that the component wafer 100 illustrated in FIG. 9 is substantially identical to the component wafer illustrated in FIGS. 3 and 4. The connector wafer 102 illustrated in FIG. 9 is substantially identical to the connector wafer illustrated in FIGS. 7 and 8 except, however, that a portion 104 thereof has been cut out to provide clearance for the active device 40.

As shown in FIG. 9, a plurality of filler wafers 106 are stacked above the connector wafer 102 to equal the height of the active device 40. The filler wafers 106 are substantially identical to the connector wafers 102 in that they define a matrix organization of Z-axis slugs. A plurality of filler wafers can be fused together to form a composite wafer or alternatively, the filler wafers can be interconnected as a consequence of the Z-axis pressure provided by housing 20. In the latter case, the filler wafers 106 are selected so that only alternate layers contain maleable contacts in order to assure that Z-axis interconnections from one wafer to another are always formed between a maleable contact and the opposed face of an aligned Z-axis slug.

A standard connector screen 108 is shown stacked above the filler wafers 106 with an interconnection wafer 109 being stacked thereabove.

In order to assure high reliability interconnections between wafers, and in recognition of the fact that Z-axis pressure may not be appropriately transferred through portions of the stack in vertical alignment with the active devices, it is preferable that all required Z-axis interconnections be made in the region surrounding the active devices rather than in vertical alignment therewith.

Although it has been mentioned that embodiments of the present invention are preferably formed of stacks of wafers wherein alternate wafers in the stacks are provided with the maleable contacts to establish wafer to wafer interconnections, it is pointed out that in certain situation, i.e., with interconnection wafers as well as with filler wafers, it may be more expedient to fuse a plurality of wafers together to form a composite wafer, for example. In such a case where a group of wafers are permanently electrically connected prior to stacking, it is only necessary that a connector wafer be incorporated between that wafer group and the next adjacent wafer.

Figure 10:
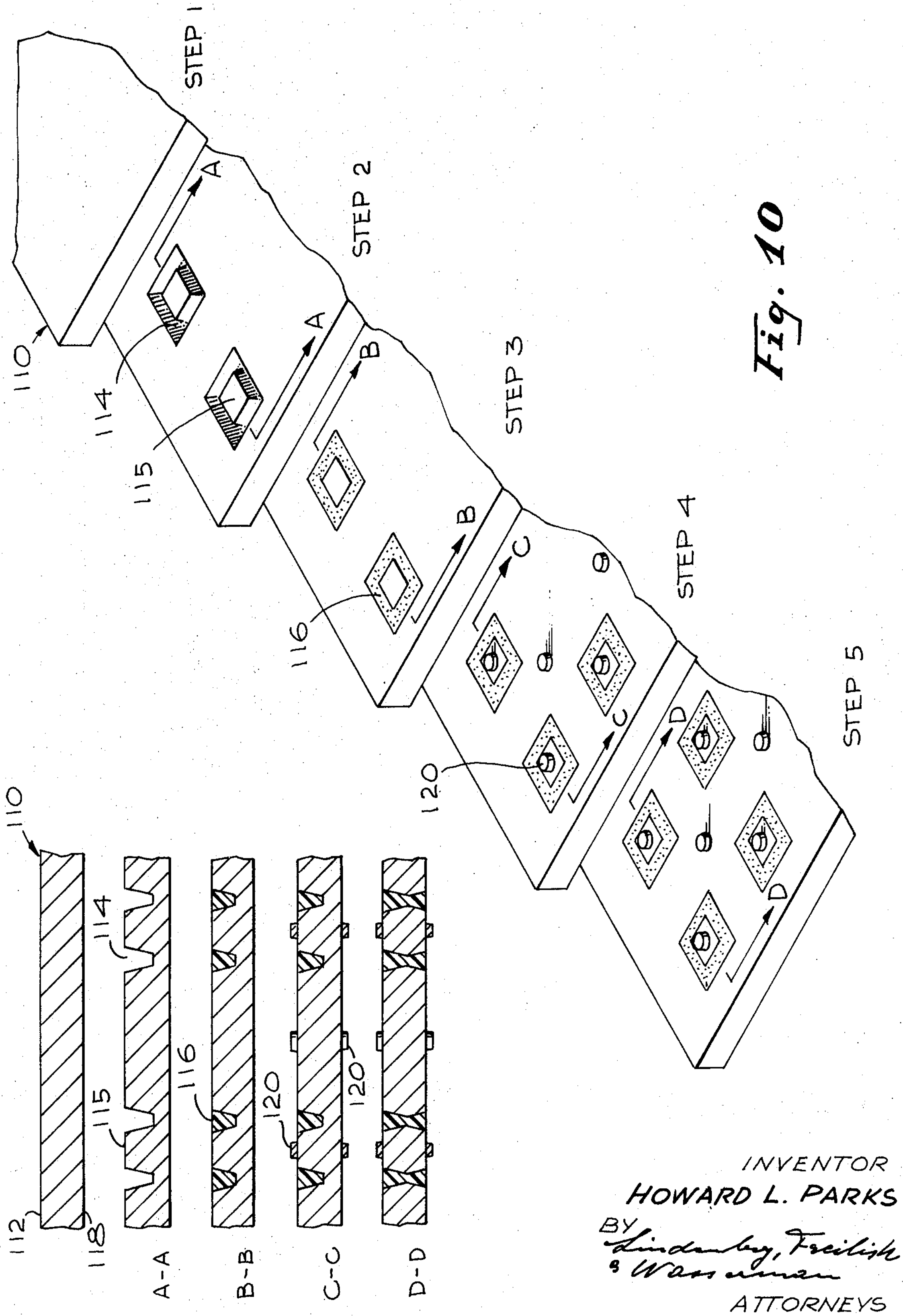
FIG. 10 is a multi-part diagram illustrating a preferred method of fabricating a connector wafer in accordance with the present invention.

Attention is now called to FIG. 10 which illustrates a preferred method of fabricating a connector wafer in accordance with the present invention. As represented in step 1 of FIG. 10, a wafer 110 of appropriate size is first secured as by cutting a sheet of copper. A suitable photo resist is then applied to the top surface 112 and the photo resist is then exposed through a mask which defines the endless paths 114, shown in step 2 surrounding each of the wafer portions 115 intended to be formed into a Z-axis slug. After exposure through the mask the top surface 112 of the wafer is chemically etched to remove wafer material as represented in step 2 of FIG. 10. Suitable dielectric epoxy 116 is then deposited in place of the wafer material etched out in step 2. The excess dielectric material is removed, as by sanding, and a photo resist material is then applied to both the top and bottom wafer surfaces 112 and 118. The photo resist material on the top and bottom surface is then exposed through a mask defining the areas in which the maleable contacts 120 should be applied. After developing, both surfaces of the wafer, as shown in step 4, are electroplated to deposit the contacts on both wafer surfaces. Thereafter, photo resist is again applied to the bottom surface 118 and the photo resist is then exposed through a mask which defines the areas to be etched in the bottom surface to bare the dielectric material deposited in step 3. After developing, the bottom surface 118 is etched to thereby isolate the slugs 115 from the remainder of the wafer material. It will be noted that the final product illustrated in step 5 of FIG. 10 corresponds to the cross-section of the connector wafer illustrated in FIG. 8.

Figure 11:
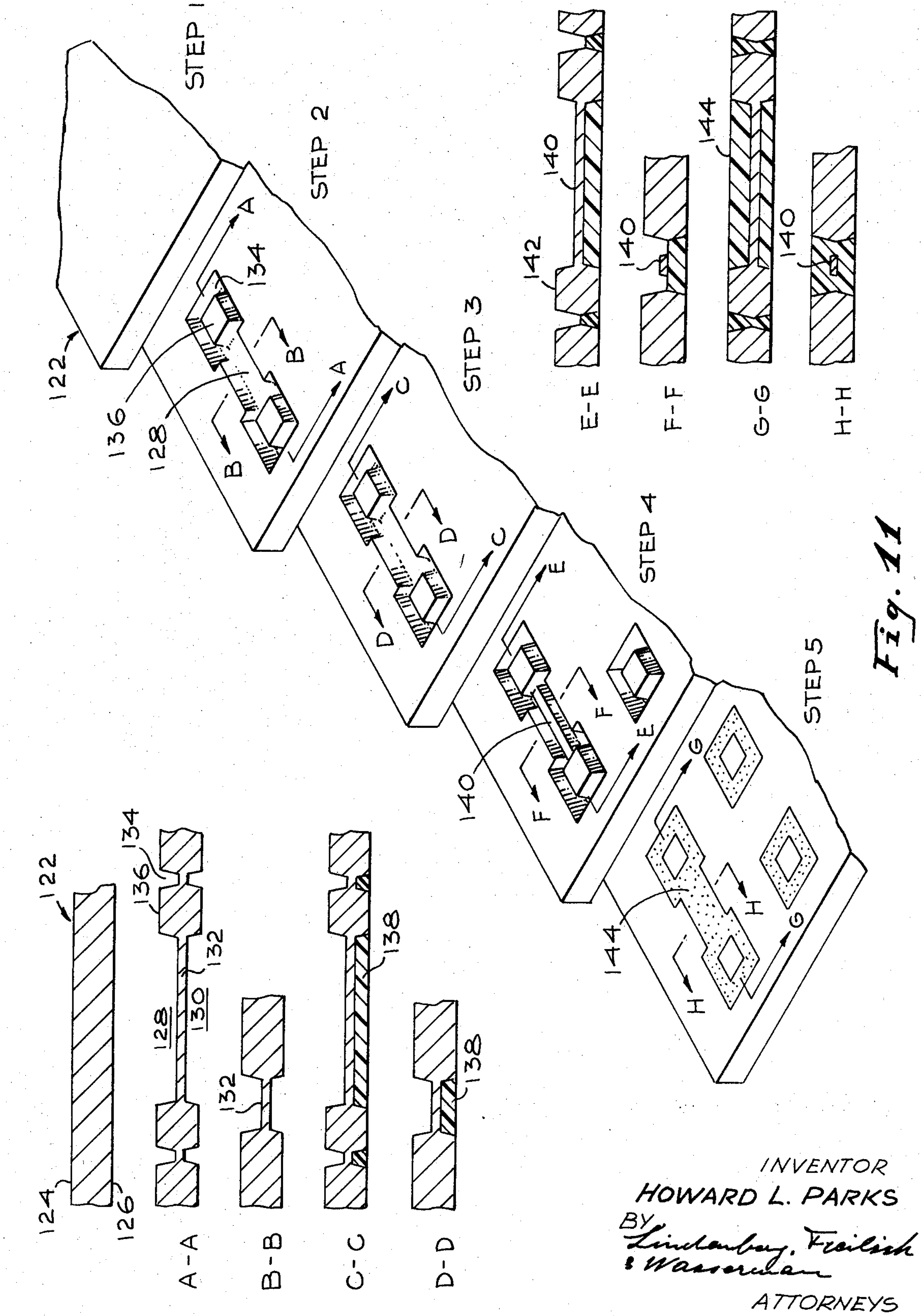
FIG. 11 is a multi-part diagram illustrating the preferred manner of fabricating an interconnection wafer in accordance with the present invention.

FIG. 11 illustrates a preferred method of fabricating the component and interconnection wafers and process is again started by cutting a copper sheet to size as in step 1 to form wafer 122. A photo resist is then applied to the top and bottom wafer surfaces 124 and 126. The photoresist is then exposed through a mask defining portions of the water material to be removed above and below where it is desired to form X–Y conductors and around the desired Z-axis slugs. The photo resist is then developed and the wafer is etched to remove material at 128 and 130 above and below a wafer portion 132. Similarly, material is removed from a trough 134 around wafer portion 136. Note that after step 2 of FIG. 11, portions 132 and 136 are still physically and electrically connected to the remainder of the wafer 122. In step 3, dielectric material 138 is deposited into the vacated areas on the bottom surface. In step 4, photoresist material is again applied to the top wafer surface, exposed through a mask, developed, and then the top wafer surface is etched to bare the dielectric material 138, and isolate the X–Y conductors 140 and Z-axis slugs 142 from the remaining wafer material as represented in step 4. Dielectric material 144 is then deposited in the vacated areas in the top wafer surface 124 as shown in step 5 to thus bury the conductor 140 and completely surround the slug 142.

From the foregoing, it should be recognized that an effective circuit packaging structure has been shown herein which in a very compact high density structure yields attractive functional characteristics including wide bandwidth interconnections, minimum circuit cross talk, efficient heat removal, and high reliability.

In a typical embodiment of the invention, the housing 20 shown in FIG. 2 may have a vertical dimension on the order of 1.6 inches with the width and depth of the housing each being about 2.7 inches. The stack 10 might then have a vertical dimension of 0.9 inches and width and depth dimensions of 1.9 inches. A typical active circuit chip size might be on the order of 0.6 inches, thus allowing about four chips to be carried by a component wafer. In order to determine the wafer area (i.e., cell size) required for a circuit chip, allowance should be made for as many free (unconnected) Z-axis slugs as are necessary to interconnect system wafer logic above and below the cell. Generally, about 1.5 free Z-axis slugs are needed for each chip terminal. An exemplary circuit strip with forty-four leads, for example, would therefore need $44 \times 2.5 = 110$ Z-axis slugs for system interconnection. In a typical 12 by 12 matrix of slugs, 25 slugs, for example, may be aligned with the chips and therefore be unusable. The remaining 119 slugs would be available for circuit and system interconnection. The cell size required, therefore, is determined by the standardized 50-mil matrix of through-slugs and the factor 2.5 times the number of circuit leads. Assume that the 44-lead chip cell is $0.6 \times 0.6 = 0.36$ square inch in the plane of the wafer and 0.047 inch high. Since each chip has an average of two interconnection wafers associated with it, which may total 0.019 inch thick including the connector wafers and of the same cell area (0.36 inch square), the cell volume can be computed by multiplying cell area by the sum thicknesses of one interconnect wafer (typically, 0.019 inches), one component wafer (typically, 0.047 inches), and two connector screens (typically, 0.005 inches each), e.g., $0.36 \times (0.019 + 0.047 + 0.010) = 0.0276$ cubic inch/chip (36 chips/cubic inch).

Since a 44-lead MOS FEB chip may contain 100 gates or better, the circuit density in the wafer stack is typically $100/0.0276 = 3{,}600$ gates/cubic inch.

The embodiments of the invention in which an exclusive property or privilege is claimed are defined as follows:

1. An electrical circuit structure including:

a first wafer comprised of electrically conductive material and having first and second substantially parallel surfaces;

an opening extending through said first wafer between said first and second surfaces thereof;

dielectric material disposed in said opening;

an island comprised of electrically conductive material identical to said first wafer material disposed within said opening supported by and electrically insulated from said first wafer by said dielectric material;

said first wafer having fingers resiliently extending therefrom;

a housing; and means mounting said first wafer in said housing with the fingers thereof in contact with said housing.

2. An electronic circuit package comprising:

a stack comprised of a plurality of flat solid wafers each having top and bottom surfaces and each formed of electrically conductive material;

each of said wafers having at least one opening formed therein extending between the top and bottom surfaces thereof;

a solid segment of electrically conductive material disposed within each of said openings spaced from the walls thereof, each of said segments terminating substantially coplanar with at least one of the surfaces of the wafer within which that segment is disposed;

each wafer including at least one segment disposed in alignment with a segment in an adjacent wafer, said aligned segments terminating substantially coplanar with opposed surfaces of said wafer and adjacent wafer, respectively;

dielectric material disposed in each of said openings adhered to the walls thereof and the segment of conductive material therein for supporting said segment with respect to the wafer and providing electrical insulation therebetween;

a circuit component supported on the top surface of a first of said wafers in said stack;

said circuit component having at least one lead electrically connected to a segment in said first wafer; and a second of said wafers in said stack being adjacent to said first wafer and having a hole into which said circuit component projects.

3. A connector means suitable for use in a multilevel circuit structure for providing shielding in an X–Y plane and coaxial through-plane connections extending in a Z-axis direction, said connector means comprising:

a flat solid wafer, formed at electrically conductive material, having top and bottom surfaces;

a uniform pattern of openings formed in said wafer extending between the top and bottom surfaces thereof;

a solid slug formed of conductive material disposed in each of said openings spaced from the walls thereof and terminating coplanar with said wafer top and bottom surfaces; and dielectric material disposed in each of said openings adhered to the opening walls and the slug therein for supporting said slug and electrically insulating it from said wafer.

4. The connector means of claim 3 including first and second contacts, formed of electrically conductive material more maleable than said slug material, connected to the opposite ends of each of said slugs.

5. The connector means of claim 3 including first and second groups of contacts, formed of electrically conductive material more maleable than said wafer material, respectively connected to said wafer top and bottom surfaces.

6. The connector means of claim 3 including fingers formed of good heat conductive material resiliently extending from the periphery of said wafer.

* * * * *